(12) United States Patent
Kilcher et al.

(10) Patent No.: US 10,483,715 B2
(45) Date of Patent: Nov. 19, 2019

(54) LASER SUPPORT FOR SEMICONDUCTOR LASER FIXATION AND LASER SUPPORT ELEMENT ASSEMBLY

(71) Applicant: North Inc., Kitchener (CA)

(72) Inventors: Lucio Kilcher, Montreux (CH); Nicolas Abele, Demoret (CH)

(73) Assignee: North Inc., Kitchener, ON (CA)

( * ) Notice: Subject to any disclaimer, the term of this patent is extended or adjusted under 35 U.S.C. 154(b) by 1202 days.

(21) Appl. No.: 14/732,528

(22) Filed: Jun. 5, 2015

(65) Prior Publication Data

US 2016/0141829 A1 May 19, 2016

(30) Foreign Application Priority Data

May 23, 2014 (CH) ...................... 0788/14

(51) Int. Cl.
*H01S 5/022* (2006.01)
*G03B 21/20* (2006.01)
*H01S 5/02* (2006.01)
*H01S 5/40* (2006.01)

(52) U.S. Cl.
CPC ...... *H01S 5/02212* (2013.01); *G03B 21/2033* (2013.01); *G03B 21/2093* (2013.01); *H01S 5/02* (2013.01); *H01S 5/0226* (2013.01); *H01S 5/4025* (2013.01)

(58) Field of Classification Search
CPC ....... G05B 2219/40103; H01S 5/02212; H01S 5/02; H01S 5/0226; G03B 21/2033; H05K 5/00; G06F 1/16
USPC .......................................... 362/259
See application file for complete search history.

(56) References Cited

U.S. PATENT DOCUMENTS

| | | | |
|---|---|---|---|
| 5,758,950 A * | 6/1998 | Naoe ................... | G02B 6/4204 362/259 |
| 7,029,193 B1 * | 4/2006 | Chao ...................... | F21L 4/005 362/118 |
| 8,976,825 B1 * | 3/2015 | Redpath ................. | H01S 5/02 372/33 |
| 2002/0164131 A1 * | 11/2002 | Yoshimura ........... | G02B 6/4206 385/88 |

(Continued)

*Primary Examiner* — Jong-Suk (James) Lee
*Assistant Examiner* — Christopher E Dunay
(74) *Attorney, Agent, or Firm* — Thomas Mahon

(57) ABSTRACT

Method for mounting a semiconductor laser element (3) into a laser holder (1), comprising the following steps:
  providing a laser holder (1) comprising a metal body (2) equipped with a substantially cylindrical housing (20) and comprising a frontal end (21) equipped with a first aperture (210) for passage of the laser beam produced by said laser element, and a back end (22) equipped with a second aperture (220) for inserting said laser element (3), said body (2) being passed through by a first group of windows (51, 52) arranged radially in a first plane (P1) perpendicular to the axis (23) of said housing (20), the angular spacing between said windows (51, 52) being regular;
  inserting said semiconductor laser element (3) into said housing (20);
  inserting an adhesive (24) for fastening said semiconductor laser element (3) into said windows (51, 52); and
  simultaneously setting the adhesive in said windows (51, 52) by means of ultraviolet light penetrating simultaneously into said windows (51, 52).

14 Claims, 5 Drawing Sheets

(56) References Cited

U.S. PATENT DOCUMENTS

| | | | | |
|---|---|---|---|---|
| 2004/0182929 A1* | 9/2004 | Aoshima | H01S 3/09415 | |
| | | | 235/454 | |
| 2004/0240499 A1* | 12/2004 | Tsuji | H01S 5/02212 | |
| | | | 372/36 | |
| 2007/0242230 A1* | 10/2007 | Chen | G02B 5/04 | |
| | | | 353/33 | |
| 2010/0328937 A1* | 12/2010 | Robitaille | G03B 21/2013 | |
| | | | 362/231 | |
| 2012/0051057 A1* | 3/2012 | Misener | G01B 11/27 | |
| | | | 362/259 | |
| 2013/0070215 A1* | 3/2013 | Higo | G03B 21/204 | |
| | | | 353/85 | |
| 2016/0208988 A1* | 7/2016 | Nemeyer | H01S 5/00 | |
| 2017/0373455 A1* | 12/2017 | Morizumi | H01S 3/02 | |

\* cited by examiner

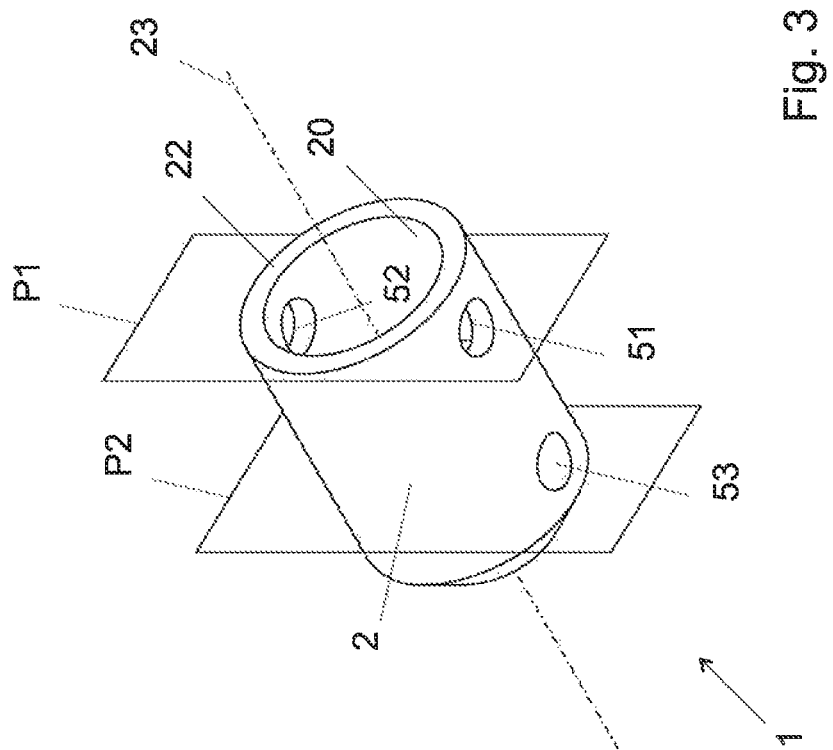

LASER SUPPORT FOR SEMICONDUCTOR LASER FIXATION AND LASER SUPPORT ELEMENT ASSEMBLY

TECHNICAL FIELD

The present invention relates to a laser holder for fastening a semiconductor laser to a device, and to the mounting of a laser element into a holder.

PRIOR ART

Semiconductor laser elements generally comprise a metal package and a window through which the laser beam is emitted. Electrical contact terminals allow them to be soldered to a printed circuit board (PCB) and them to be electrically connected to an electronic circuit supplying power to the laser. However, fastening by soldering of pins does not allow the direction in which the laser beam is emitted to be precisely controlled.

However, there are many applications, especially in optical disc read heads or in laser micro-projectors, for which it is necessary to emit the beam in a precise direction. For this reason, laser holders that allow the semiconductor laser element to be held and aligned via its periphery are frequently employed. One example of such a holder is described in document EP2453534.

Semiconductor lasers generate a relatively large amount of heat that must be removed in order to guard against variations in the emitted wavelength or movement of the beam caused by expansions. Known laser holders therefore also have the aim of helping to remove this heat, especially by increasing the heat exchange surface about the laser.

The semiconductor laser elements may be wedged, screwed or adhesively bonded in their holder. Whatever the fastening mode employed, it is however crucial to guarantee the laser element is perfectly centered in its housing.

One aim of the present invention is therefore to provide a new type of laser holder.

One aim of the present invention is also to provide a new method for mounting a semiconductor laser element into a laser holder.

In particular, one aim is also to provide a laser holder that allows heat to be effectively removed.

Another aim is to provide an easy method for mounting the laser element into the holder.

Another aim is to provide a method for mounting the laser element into the holder that ensures the laser element is precisely and reproducibly centered.

Another aim is to provide a laser holder that allows the position and orientation of the laser element in the holder to be adjusted.

BRIEF SUMMARY OF THE INVENTION

According to the invention, these aims are achieved especially by means of a method for mounting a semiconductor laser element into a laser holder, comprising the following steps:

providing a laser holder comprising a metal body equipped with a substantially cylindrical housing and comprising a frontal end equipped with a first aperture for passage of the laser beam produced by said laser element, and a back end equipped with a second aperture for inserting said laser element, said body being passed through by a first group of windows arranged radially in a first plane perpendicular to the axis of said housing, the angular spacing between said windows being regular;

inserting said semiconductor laser element into said housing;

inserting an adhesive for fastening said semiconductor laser element into said windows; and simultaneously setting the adhesive in said windows by means of ultraviolet light penetrating simultaneously into said windows.

This method is advantageous because the semiconductor element is held by a plurality of points of adhesive distributed symmetrically about the axis of the housing. The tensile stress applied by the adhesive is therefore distributed symmetrically about the semiconductor element, this being favorable to the centering.

Furthermore, the various points of adhesive are set simultaneously by means of ultraviolet light introduced simultaneously via the various windows. Thus there is no risk of one of the points of adhesive setting before the semiconductor element has been perfectly centered; changes to the volume and hardness of the adhesive during setting apply symmetrically from the various windows, so that the resultant stress applied to the semiconductor element due to setting of the adhesive is zero.

After the adhesive has set and during use of the semiconductor laser element, this arrangement furthermore makes it possible for the heat generated to diffuse symmetrically and uniformly, thereby avoiding the risk of strain due to temperature differences along the periphery of the laser holder.

The first group of windows advantageously consists of two windows arranged symmetrically in the first plane about said axis. The presence of only two windows allows the number of points of adhesive and the number of points of injection of ultraviolet light to be minimized while nonetheless allowing a symmetrical adhesive bond to be obtained.

A number of windows in the first group different from two may however be used, for example three windows at 120° from each other, or four windows at 90° from each other.

The body may be passed through by a second group of windows arranged radially in a second plane parallel to the first plane, the angular spacing between said windows of the second group being regular. The method may then comprise a step of inserting adhesive into the windows of the second group and simultaneously setting the adhesive in all the windows of the first and second groups.

The windows of the second group may be used to more effectively hold the semiconductor element by adhesively bonding it to another plane. Advantageously, these windows of the second group are used to adhesively bond a lens passed through by the light of the semiconductor element and mounted in the holder.

The second group may consist of two windows in the second plane and arranged symmetrically about said axis. A different number of windows may be provided.

The number of windows in the first and second groups may be equal or different. Advantageously, the windows of the first group are aligned with and equal in number to the windows of the second group.

The windows may comprise a cylindrical first portion.

The windows may comprise an external cylindrical first portion and an internal second portion. The cross section of the cylindrical second portion may be larger than the cross section of the cylindrical first portion, thereby allowing the area of contact between the adhesive and the semiconductor laser element or between the adhesive and the lens to be increased.

The method may comprise filling the internal second portion with said adhesive.

The light may reach the second portion by reflection of ultraviolet light against the walls of said windows.

Some of the ultraviolet light may be reflected against the walls of the semiconductor laser element before acting on the adhesive.

Some of the ultraviolet light may be reflected against the walls of the lens before acting on the adhesive.

Some of the ultraviolet light may pass through the lens before acting on the adhesive.

The semiconductor laser element may be wedged inside the housing. This allows optimal thermal contact to be made and therefore the heat generated to be effectively removed. This furthermore allows the semiconductor laser element to be precisely centered.

Since the outside diameter of the semiconductor laser elements is not always guaranteed to within a tight tolerance, it is also possible to make provision for a slight play between the laser element and the holder. In this case, the adhesive may flow into this play, and contribute to defining the centering.

A lens may be inserted into the housing of the body.

A plurality of, three for example, laser holders holding lasers of different wavelengths may be inserted into a metal module equipped with apertures facing at least some of said windows.

The above aims are also achieved by means of a laser holder comprising a metal body equipped with a substantially cylindrical housing for housing therein a semiconductor laser element mounted using the above method, said body comprising a frontal end equipped with a first aperture for passage of the laser beam produced by said laser element, and a back end equipped with a second aperture for inserting said laser element, said body being passed through by a first group of windows arranged radially in a first plane perpendicular to the axis of said housing, the angular spacing between said windows being regular, and said windows being at least partially filled with an adhesive for fastening said semiconductor laser element.

BRIEF DESCRIPTION OF THE FIGURES

Exemplary embodiments of the invention are indicated in the description illustrated by the appended figures, in which:

FIG. 3 illustrates a third perspective view of an exemplary laser holder according to one embodiment of the invention;

EXEMPLARY EMBODIMENT(S) OF THE INVENTION

Figure 2:
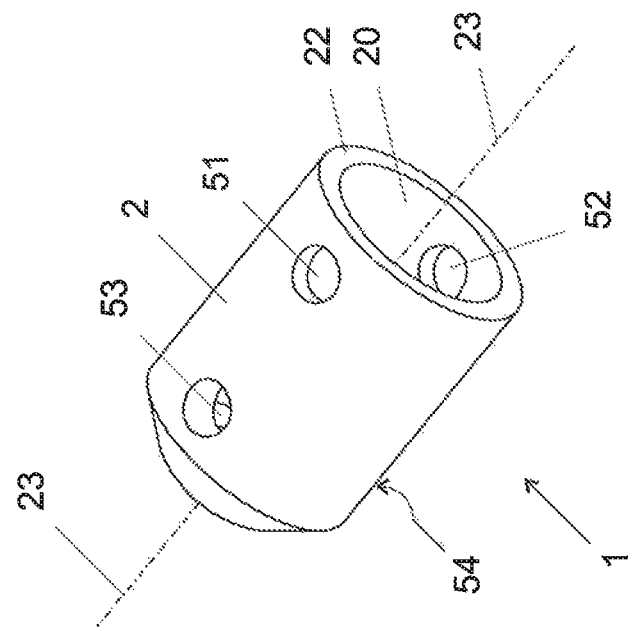
FIG. 2 illustrates a second perspective view of an exemplary laser holder according to one embodiment of the invention.
Figure 1:
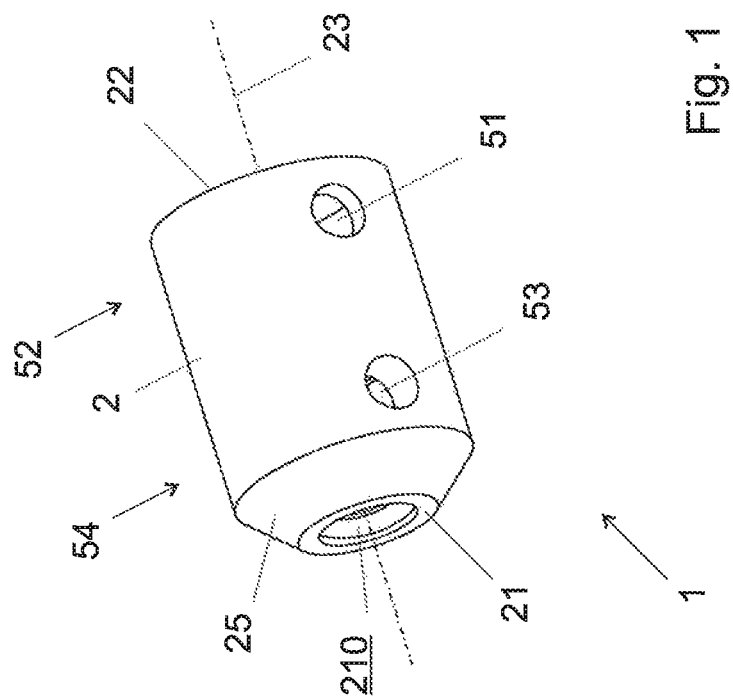
FIG. 1 illustrates a first perspective view of an exemplary laser holder according to one embodiment of the invention.
Figure 5:
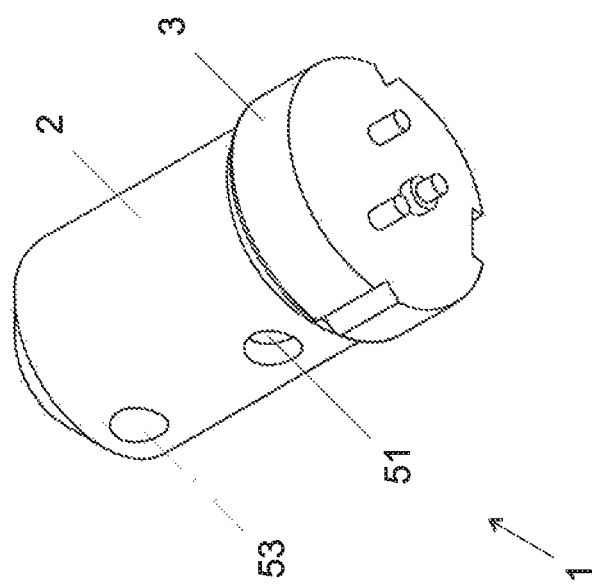
FIG. 5 illustrates a second perspective view of an exemplary laser holder with the laser mounted, according to one embodiment of the invention.
Figure 4:
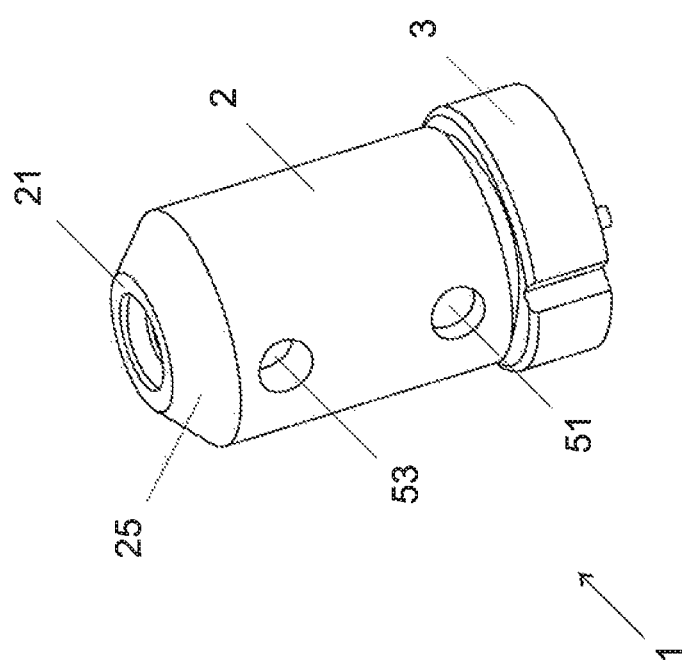
FIG. 4 illustrates a first perspective view of an exemplary laser holder with the laser mounted, according to one embodiment of the invention.

An exemplary laser holder 1 according to one embodiment of the invention is illustrated in FIGS. 1 to 5, the holder being equipped with its semiconductor laser element 3 in FIGS. 4 and 5. The laser element 3 may for example be a semiconductor laser chip, for example a laser diode or VCSEL (vertical-cavity surface-emitting laser) laser chip encapsulated in a TO-3.8 mm or TO-5.6 mm transistor-outline (TO) can package.

The laser holder 1 essentially comprises a metal body 2, for example a body made of steel, of substantially cylindrical shape. It may be produced using a die-casting method, in order to ensure a high shape precision; high-precision machining is also possible. One of the ends of the body 2 terminates in a frustoconical portion 25 defining a frontal end 21 perpendicular to the longitudinal axis of symmetry 23 of the body. An aperture 210, for example a circular aperture, is drilled through this frontal end 21 and allows the laser beam produced by the laser element 3 to leave the holder. The diameter of the aperture 210 is preferably smaller than the diameter of the laser beam emitted by the laser element; the aperture thus acts as a pinhole, or pin stop, and defines the shape and cross section of the laser beam emitted.

A housing 20 is provided inside the body 2 in order to house therein the semiconductor laser element 3. In this embodiment, the housing is essentially cylindrical in shape, excluding the front portion which terminates in a conical portion corresponding substantially to the external cone 25.

The diameter of the housing 20 allows a TO-3.8 mm or TO-5.6 mm element to be inserted therein and for example wedged therein. Direct contact is thus ensured between the outside walls of the laser element 3 and the holder 2, allowing the heat generated by the laser diode 3 to be effectively removed.

In another embodiment, compatible with laser elements the outside diameter of which is variable due to manufacturing tolerances, the laser element is inserted into the housing 20 with a slight play 211. In this case, the adhesive 24 flows into this play and contributes to holding the laser element 3 centered. The adhesive 24 is preferably an adhesive chosen for its good thermal conductivity, for example an adhesive containing thermally conductive particles in its composition, for example an epoxy adhesive containing silver particles or an adhesive containing carbon nanotubes or a silver chloride and silver adhesive, or a carbon-based adhesive.

After the laser element 3 has been inserted into the housing 20 and adhesively bonded, adhesive may also be inserted from the back into the housing 20 in order to at least partially fill any gap left at the back of the housing, and the play 211, and thus improve heat transfer between the laser element and the holder 2.

The laser holder 1 comprises a first group of windows consisting in this example of the two windows 51, 52. The center of all the windows of this group is located in the same plane P1 perpendicular to the axis of symmetry 23 of the housing 20 and of the holder 1. The windows are distributed at an angular distance from each other about the axis 23; in the case illustrated of a group with two windows, the angular distance between the windows 51 and 52 is therefore 180°.

In the general case of a group with N windows, the angular distance between adjacent windows is 360°/N. This arrangement makes it possible to ensure that the adhesively bonded points are symmetrically distributed about the axis 23, and therefore makes it possible to prevent movement of the laser 3 in its holder due to tensile stresses exerted by the adhesive 24 especially while it is setting. However, the use of two windows is enough to ensure a symmetrical distribution and allows the length and cost of the adhesive bonding operation to be decreased.

Figure 6:
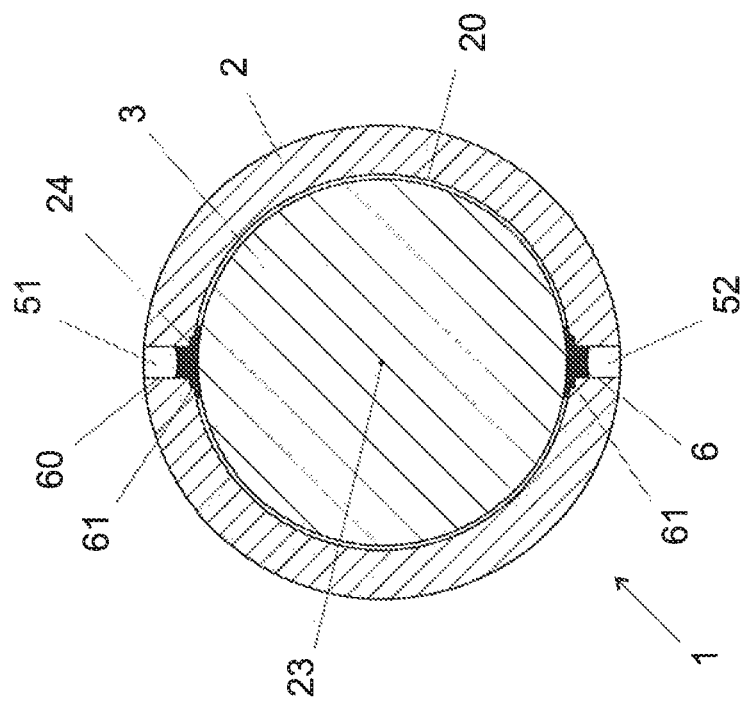
FIG. 6 illustrates a transverse cross-sectional view of a laser holder with the laser mounted, according to a first embodiment of the invention.

The windows 51, 52 of the first group allow the semiconductor laser element 3 to be adhesively bonded in its holder 2 by means of adhesive 24 inserted into each window, as illustrated in the cross-sectional view in FIG. 6. The adhesive 24 is inserted in turn, or simultaneously, into each of the two windows 51, then 52, before being simultaneously set by means of ultraviolet light injected simultaneously into the two windows 51 and 52 in order to simultaneously set the adhesive in all the windows.

Figure 7:
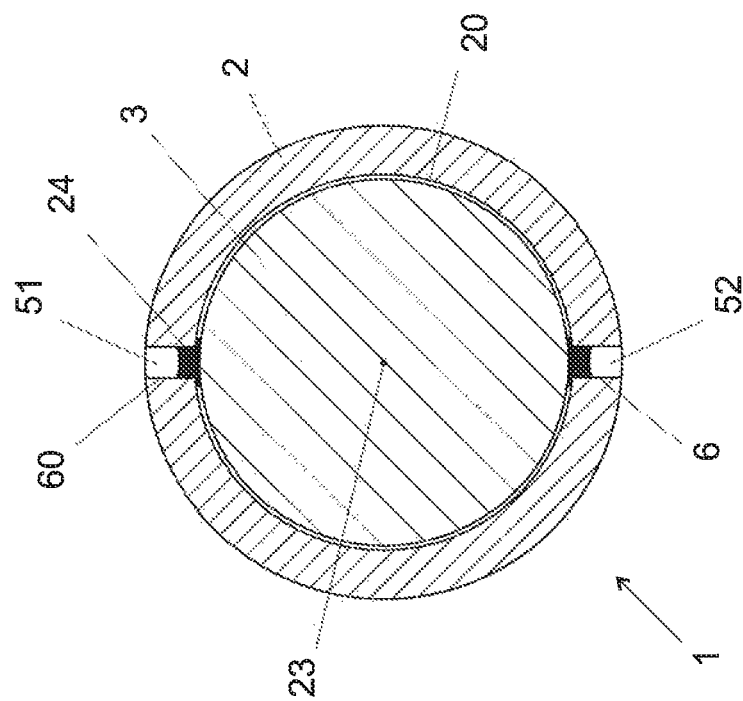
FIG. 7 illustrates a transverse cross-sectional view of a laser holder with the laser mounted, according to a second embodiment of the invention.

Each window has a circular cross section in a cylindrical portion 60. In the embodiment in FIG. 7, the two windows comprise an external cylindrical first portion 60 and an internal second portion 61, which may also be cylindrical. The cross section of the cylindrical second portion 61 is larger than the cross section of the cylindrical first portion 60 in order to increase the area of contact between the adhesive 24 and the laser element 3.

Ultraviolet light penetrating into the windows 51, 52 via their external portion 60 is reflected against the reflective sidewalls of the window, and possibly against the reflective walls of the laser element 3, in order to irradiate the entire volume of the adhesive 24, including the volume in the internal portion 61.

A second group of windows 53, 54 may be provided in a second plane P2 parallel to the plane P1. The number of windows in the second plane P2 may be equal or different to the number of windows in the first plane P1. In one advantageous embodiment, the windows of the two groups are aligned. The cross section of the windows of the second group may be identical or different to those of the first group, and for example comprise one portion 60, or two portions 60, 61 as illustrated in the cross-sectional views in FIGS. 6 and 7.

The second group of windows 53, 54 may be used to adhesively bond another portion of the semiconductor laser element 3. Advantageously, it is used to adhesively bond a lens (not shown) that may be mounted between the laser element 3 and the aperture 210.

Figure 8:
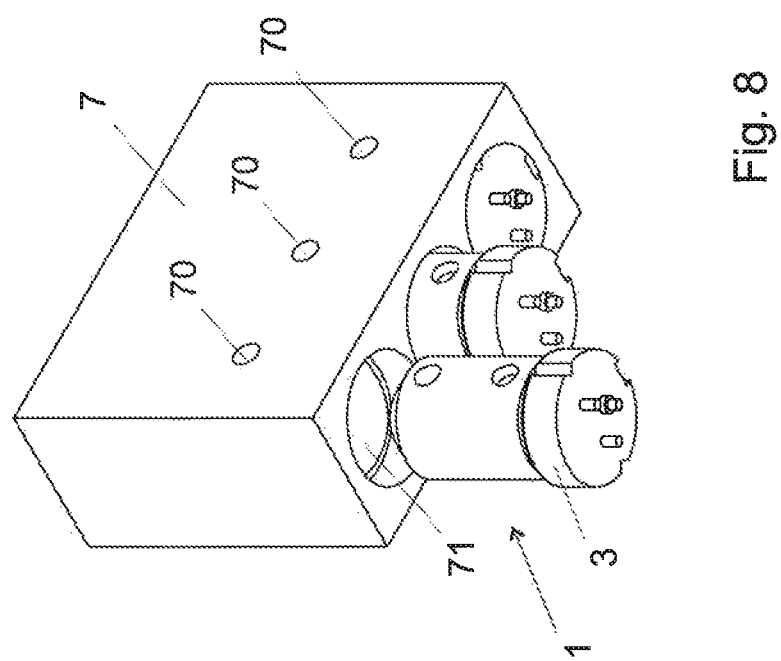
FIG. 8 illustrates a perspective view of a module in which three lasers are each mounted in its laser holder, according to one embodiment of the invention.

FIG. 8 illustrates a projection module 7 comprising three laser holders 1 according to the invention. The three laser holders may be equipped with three lasers of different wavelength, for example 640 nm for the red, 520 nm for the green and 460 nm for the blue, in order to collaborate with a beam combiner in order to produce a beam of laser light the wavelength of which may be controlled by varying the proportion of the three colors. Such a module is for example used in combination with orientable mirrors in image microprojectors, retinal projection spectacles, head-mounted displays or head-up displays, for example. The laser holders are for example housed side-by-side in three housings 71 of the module 7, and fastened by means of a thermosetting and/or UV-cured adhesive having a good thermal conductivity, said adhesive being distributed on the circumference of the holders 2 and/or inserted into apertures 70 through the walls of the module 7. The module 7 may be made of metal in order to promote heat removal.

REFERENCE NUMBERS EMPLOYED IN THE FIGURES

1 Laser holder
2 Body
20 Housing
21 Frontal end
210 Aperture for passage of the laser beam
211 Play between the housing 20 and the laser element 3
22 Back end
220 Aperture for inserting the laser element
23 Longitudinal axis of the housing
24 Adhesive
25 Conical portion
3 Semiconductor laser element
51 First window of the first group of windows
52 Second window of the first group of windows
53 First window of the second group of windows
54 Second window of the second group of windows
60 First portion of the windows
61 Second portion of the windows
7 Projection module
70 Apertures
71 Housings

The invention claimed is:

1. A laser holder comprising:
   a substantially cylindrical body, the body comprising:
      a front end having a first aperture having a first diameter to transmit a laser beam produced by a semiconductor laser element, the first diameter to be smaller than a diameter of the laser beam;
      a back end having a second aperture, the first aperture and the second aperture arranged along an axis;
      a first group of windows arranged radially in a first plane, the first plane substantially perpendicular to the axis, the first group of windows at least partially fillable with an adhesive to fasten the semiconductor laser element to the body and each window of the first group of windows comprising an external cylindrical portion and an internal cylindrical portion, the internal cylindrical portion closer to the axis than the external cylindrical portion, the cross section of the internal cylindrical portion to be larger than the cross section of the external cylindrical portion.

2. The laser holder of claim 1, an angular spacing between windows of the first group of windows to be substantially regular.

3. The laser holder of claim 1, the second aperture having a second diameter to accommodate insertion of the semiconductor laser element into the body.

4. The laser holder of claim 1, comprising a second group of windows arranged radially in a second plane, the second plane substantially parallel to the first plane, the angular spacing between windows of the second group of windows to be substantially regular.

5. The laser holder of claim 4, the second group of windows at least partially fillable with an adhesive to fasten a lens to the body.

6. The laser holder of claim 1, the body comprising steel or steel alloy.

7. The laser holder of claim 1, at least the internal cylindrical portion filled with an adhesive to fasten the semiconductor laser element at least partially within the body.

8. An apparatus comprising:
- a projection module comprising a plurality of cylindrical housings, each of the plurality of cylindrical housings comprising at least one external aperture;
- a plurality of substantially cylindrical bodies to be inserted into the plurality of cylindrical housings, each of the plurality of bodies comprising:
  - a front end having a first aperture having a first diameter to transmit a laser beam produced by a semiconductor laser element, the first diameter to be smaller than a diameter of the laser beam;
  - a back end having a second aperture, the first aperture and the second aperture arranged along an axis;
  - a first group of windows arranged radially in a first plane, the first plane substantially perpendicular to the axis, at least one of the first group of windows to be substantially aligned with a corresponding one of the external apertures and at least partially fillable with an adhesive to fasten the semiconductor laser element to the body, and each window of the first group of windows comprising an external cylindrical portion and an internal cylindrical portion, the internal cylindrical portion closer to the axis than the external cylindrical portion, the cross section of the internal cylindrical portion to be larger than the cross section of the external cylindrical portion.

9. The apparatus of claim 8, an angular spacing between windows of the first group of windows to be substantially regular.

10. The apparatus of claim 8, the second aperture having a second diameter to accommodate insertion of the semiconductor laser element into the body.

11. The apparatus of claim 8, comprising a second group of windows arranged radially in a second plane, the second plane substantially parallel to the first plane, the angular spacing between windows of the second group of windows to be substantially regular.

12. The apparatus of claim 11, the second group of windows at least partially fillable with an adhesive to fasten a lens to the body.

13. The apparatus of claim 8, a one of the semiconductor laser elements fastened to a one of the plurality of bodies to emit a laser beam having a different color light than another one of the semiconductor laser elements fasted to another one of the plurality of bodies.

14. The apparatus of claim 8, at least the internal cylindrical portion filled with an adhesive to fasten the semiconductor laser element at least partially within the body.

* * * * *